(12) United States Patent
Hinz et al.

(10) Patent No.: US 7,456,665 B2
(45) Date of Patent: Nov. 25, 2008

(54) PHASE SHIFTER

(75) Inventors: Torsten Hinz, München (DE); Andreas Jakobs, München (DE); Benaissa Zaryouh, Dallas, TX (US)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 11/464,999

(22) Filed: Aug. 16, 2006

(65) Prior Publication Data
US 2007/0115035 A1 May 24, 2007

(30) Foreign Application Priority Data
Aug. 16, 2005 (DE) .................. 10 2005 038 736

(51) Int. Cl.
*H03L 7/06* (2006.01)
(52) U.S. Cl. .................. 327/158; 327/161
(58) Field of Classification Search .......... None
See application file for complete search history.

(56) References Cited

U.S. PATENT DOCUMENTS

| | | | | |
|---|---|---|---|---|
| 5,355,037 A * | 10/1994 | Andresen et al. | ............ | 327/158 |
| 5,451,894 A * | 9/1995 | Guo | ............ | 327/241 |
| 5,544,203 A * | 8/1996 | Casasanta et al. | ............ | 375/376 |
| 5,900,762 A | 5/1999 | Ramakrishnan | | |
| 5,920,518 A * | 7/1999 | Harrison et al. | ............ | 365/233 |
| 6,633,190 B1 * | 10/2003 | Alvandpour et al. | ........ | 327/291 |
| 6,859,082 B2 * | 2/2005 | Tang | ............ | 327/276 |
| 7,088,158 B2 * | 8/2006 | Block et al. | ............ | 327/158 |
| 7,227,809 B2 * | 6/2007 | Kwak | ............ | 365/233 |

FOREIGN PATENT DOCUMENTS

WO 02095943 11/2002

* cited by examiner

*Primary Examiner*—Cassandra Cox
(74) *Attorney, Agent, or Firm*—Dicke, Billig & Czaja, PLLC

(57) ABSTRACT

A Phase shifter for generating a phase-shifted, in particular phase-delayed, output signal from an input signal is disclosed. In one embodiment, the phase shifter includes a first delay line and at least one further delay line with respectively cascaded delay elements that form a U-shaped signal path along which at least one delay element is adapted to be controlled to be optionally opening or closing. A phase discriminator located at the input side of which a clock signal and a signal from one of the delay lines can be applied, and the output side of which is connected with a respective control input of the delay elements. The clock signal can also be applied to the first delay line, so that a feedback loop is formed by the phase discriminator and at least one of the delay lines. The input signal can be applied to the delay line whose signal output is not connected with the phase discriminator, and the output signal can be output therefrom.

23 Claims, 6 Drawing Sheets

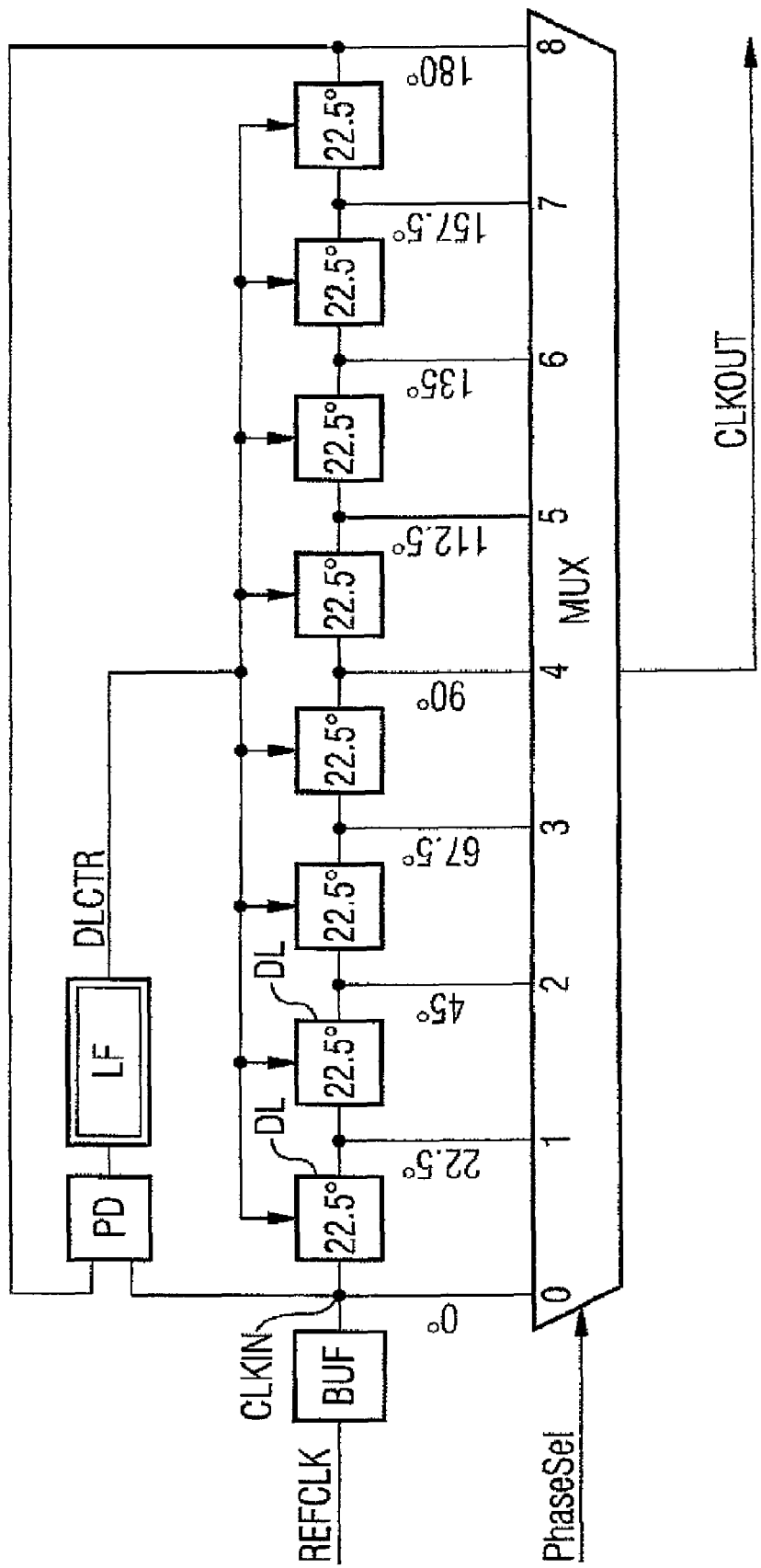

PHASE SHIFTER

CROSS-REFERENCE TO RELATED APPLICATIONS

This Utility Patent Application claims priority to German Patent Application No. DE 10 2005 038 736.5 filed on Aug. 16, 2005, which is incorporated herein by reference.

BACKGROUND

The invention relates to a device and a method for generating a phase-shifted, in particular phase-delayed, output signal from an input signal, in particular for use in micro electronics.

In micro electronics, delay synchronization loops ('Delay Locked Loops'; DLLs) are used to generate a clock signal derived from a reference clock signal with a predetermined fixed relative phase relationship.

Known DLLs include a delay line constructed of cascaded identical delay elements, the delay line being fed by the reference clock signal via a buffer. A phase discriminator that usually checks for 180° phase shifting compares the phase relationship of a signal at the beginning and of an inverted signal at the end of the delay line. If a phase difference exists, control information is generated to adjust the delay of the delay elements. As soon as the feedback loop has converged, i.e. the signals have been synchronized, a phase difference of 180° or 180° +n·360°, respectively, is present between the beginning and the end of the delay line. By a control information regulation algorithm, n=1, 2, 3, . . . is usually set. Between the delay elements, phases with a corresponding offset can be tapped by means of a multiplexer and be output as a derived clock signal. Due to the construction as a feedback loop, all changes of the method parameters, voltage, or temperature (which all change the delay of the delay elements) are compensated for to the extent that they relate to the entire delay line. However, there exist two intrinsic non-compensated delay components: both the buffer and the multiplexer include a propagation delay. Thus, a phase shifting between the reference clock signal and the clock signal derived therefrom occurs even if a phase of 0° is set by the multiplexer. Another problem is that the intrinsic delay is completely dependent on the manufacturing process, the voltage, and the temperature. If the resolution is to be increased, the delay of the multiplexer that is necessarily also larger will also be increased.

For these and other reasons, there is a need for the present invention.

SUMMARY

The present invention provides for a phase shifter for generating a phase-shifted, in particular phase-delayed, output signal from an input signal, enabling an improved shift or delay compensation.

In one embodiment, the phase shifter has a first delay line and at least one further delay line with respectively cascaded delay elements that form a U-shaped signal path along which at least one delay element is adapted to be controlled to be optionally opening or closing, and a phase discriminator at the input side of which a clock signal and a signal from one of the delay lines can be applied, and the output side of which is connected with a respective control input of the delay elements. The clock signal can also be applied to the first delay line, so that a feedback loop is formed by the phase discriminator and at least one of the delay lines. The input signal can be applied to the delay line whose signal output is not connected with the phase discriminator, and the output signal can be output therefrom.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 illustrates a schematic draft representation of a delay synchronization loop according to prior art.

DETAILED DESCRIPTION

Figure 2A:
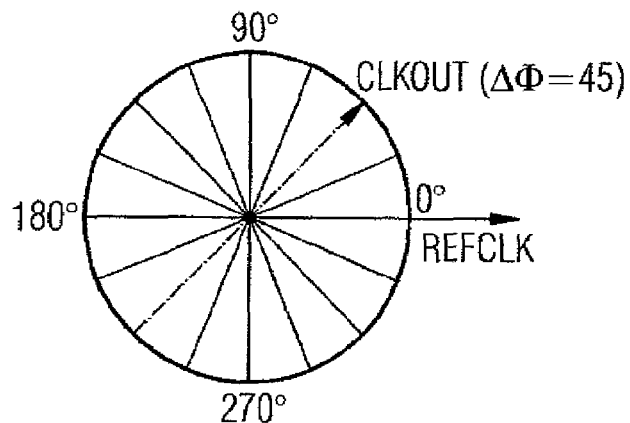
FIG. 2A illustrates the phase relationship between a reference clock signal and the output clock signal derived therefrom, under ideal conditions.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In one embodiment, the phase shifter includes at least two shift or delay lines, each with cascaded shift or delay elements. The delay lines each form a U-shaped signal path along which at lest one delay element is adapted to be controlled to be optionally opening or closing, i.e. permits signals to pass to the next delay element or directs them back to the previous delay element.

To the input side of a phase discriminator that is furthermore available and the functioning of which is known to a person skilled in the art, both an input signal and a signal can be applied which is output from one of the delay lines (typically from a signal output connection). The input signal may basically be any signal, but, for simpler design, it is advantageous if the signal is regular, for instance, a clock signal. In the following part of the description, the invention will be described by means of a clock signal as an input signal for the phase discriminator without this having to be understood as a restriction. At the output side, the phase discriminator is connected with a respective control input of the delay elements. The clock signal can also be applied to the first delay line. By means of the phase discriminator and at least one of the delay lines there results a feedback loop, e.g., a DLL. The input signal can be applied to the (respective) delay line whose signal output is not connected to the phase discriminator, and simultaneously the output signal results from the passing through and outputting of this (respective) delay line.

This general form of the phase shifter thus includes delay lines that are connected in series (the clock signal may—depending on the switching position—pass through one, or a plurality of, or all, delay lines successively).

Also included are master/slave configurations in which a first delay line ("master")forms the feedback loop together with the phase discriminator (e.g., by a separate connecting of input and output of the delay line to the inputs of the phase discriminator) while the other delay line(s) ("slave")is (are) synchronized dependently and exclusively serve the generation of output signals. Then, a respective input signal can preferably be applied to each of the further delay lines, and a respective output signal can be output therefrom. Mixed forms are also possible. The series configuration and the master/slave configuration will be explained in more detail further below.

Several further delay lines are available—which can be controlled individually. In particular in the case of the master/slave configuration, a delay line may, for instance, serve to delay the input clock signal for the generation of an output clock signal, a further one for the delay or phase shifting, respectively, of a READ-DQS-signal, and so on.

Also, the delay lines may have differing structures, e.g., with a differing number of delay elements, differing phase delays of the delay elements, the selection of delay elements with one or several phase delay values, and so on. In the case of the master/slave configuration, for instance, a master delay line may have a smaller number of delay elements than the slave delay line which might additionally include finer and switchable phase delays. Another slave delay line might in turn have other characteristics that are adapted to the respective use, e.g., a delay of chip clock signals or of signal bursts.

A loop filter is placed between the phase discriminator and the delay elements so as to avoid oscillations.

At least in the delay line(s) forming the feedback loop, the delay elements are designed such that, in a switching state of this/these delay line(s), the delay corresponds to the nominal phase angle $\Theta$ of the phase discriminator. It is then especially advantageous if all delay elements can have the same nominal phase delay $\Delta\phi$ such that there applies $n\cdot\Delta\phi=\Theta$, with n being a positive or a negative integer number. Of course, more or even less delay elements may generally also be available.

For adjusting a fine phase delay it is of advantage if at least one delay element is adapted to be switched between at least two phase delay values $\Delta\phi_1$, $\Delta\phi_2$, e.g., $\Delta\phi_1=22.5°$ and $\Delta\phi_2=30°$. It is especially favorable if the adjustable phase delay values $\Delta\phi_1$, $\Delta\phi_2$ are fractionally, i.e. are in a substantially fixed relative relationship at different frequencies, i.e. $\Delta\phi_1:\Delta\phi_2\approx$const., e.g., $22.5°:30°=3/4$. Then, it is even more favorable if each of the phase delay values $\Delta\phi_1,\Delta\phi_2$, multiplied with a respective (positive or negative) natural number $n_1$, $n_2$, corresponds to the phase angle of the phase discriminator, i.e. $\Theta=n_1\cdot\Delta\phi_1=n_2\cdot\Delta\phi_2$, in particular with $\Theta=180°$, e.g., $22.5°\cdot 8=6\cdot 30°=180°$. The relationships of the delay values are substantially constant over a PVT and/or frequency range, so that the delay lines favorably are calibrated initially, i.e. either during the manufacturing or on activation, by a suitable calibration possibility. Of course, the one or several ones of the delay line(s) can also be calibrated later—with or without interruption during operation. The calibration may be performed at the individual delay lines or at coupled delay lines. A calibration of delay lines as such may be taken from prior art.

FIG. 1 illustrates a known multi-phase delay synchronization loop having a delay line that is constructed of cascaded identical delay elements DL. The delay elements DL shift the phase by 22.5° respectively. The delay line is fed at its beginning A by the reference clock signal REFCLK via a buffer BUF. A phase discriminator PD that checks, in the instant case, for 180° compares the phase relationship at the beginning A and at the end B of the delay line. In general, even if this sometimes appears unusual, phase discriminators that check for other angles may also be used, wherein the delay lines will then have to be designed correspondingly. If a phase difference exists, a control information DLCTR is generated so as to adjust the delay of the delay elements DL. Typically, a loop filter LF is incorporated to avoid oscillations. As soon as the feedback loop has converged, i.e. the signals have been synchronized, a phase difference of 180° is present between the beginning A and the end B of the delay line. Since all the eight delay elements are identical, phases with shifts of $n\times 22.5°$ ($0\leq n\leq 8$) can be tapped by a multiplexer MUX to output the respective phase as a derived output clock signal CLKOUT as a function of the phase output control input PhaseSel. If phases between 180° and 360° are required, the inverse of the corresponding phase is used. For a higher resolution, the number of the delay elements DL may be increased, or two delay synchronization loops may be cascaded, one for a coarse delay selection and one for a fine delay selection. Due to the construction as a feedback loop, all changes of the method parameters, voltage, or temperature (which all change the delay of the delay elements DL) are compensated for to the extent that they concern the entire delay line. However, both the buffer BUF and the multiplexer MUX each include an intrinsic non-compensated propagation delay, so that a phase shift between the reference clock signal REFCLK and the clock signal CLKOUT derived therefrom occurs even if a phase of 0° is adjusted by the multiplexer MUX, cf. also FIGS. 2A and 2B. In particular if the resolution is to be increased, i.e. smaller than 22.5°, does the delay of the necessarily larger multiplexer MUX also become larger. A higher resolution thus potentially also causes a higher output error.

FIG. 2A illustrates the phase relationship between the reference clock signal REFCLK and a clock signal CLKOUT of FIG. 1 derived at the delay elements by phase selection for the ideal case of completely compensated delays. Each of the angle arrangements corresponds to the phase delay of 22.5° illustrated in FIG. 1, with the arrow indicating a concrete selection of n=2, corresponding to a shift of 45° between CLKOUT and REFCLK.

Figure 2B:
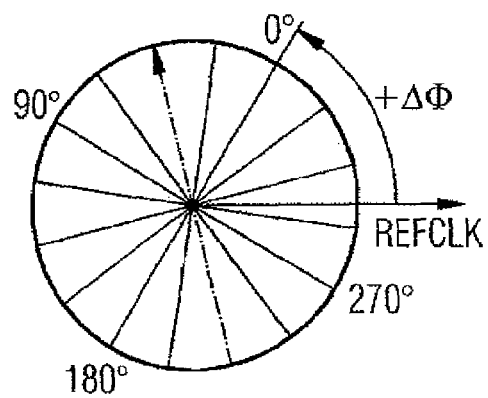
FIG. 2B illustrates the phase relationship between a reference clock signal and the clock signal derived therefrom, under realistic conditions.

FIG. 2B illustrates a realistic phase shift due to the intrinsically non-compensated propagation delay by the buffer and the multiplexer. It reveals that the derived clock signal CLKOUT is shifted farther than adjusted (to 45°), namely by 60°, as is indicated by the curved arrow. The delay depends on manufacturing method parameters, voltage, and temperature (PVT).

Figure 3B:
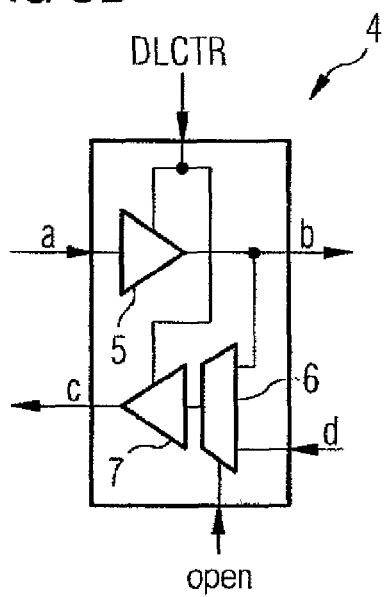
FIG. 3B illustrates a delay element belonging to the phase shifter of FIG. 3A.
Figure 3A:
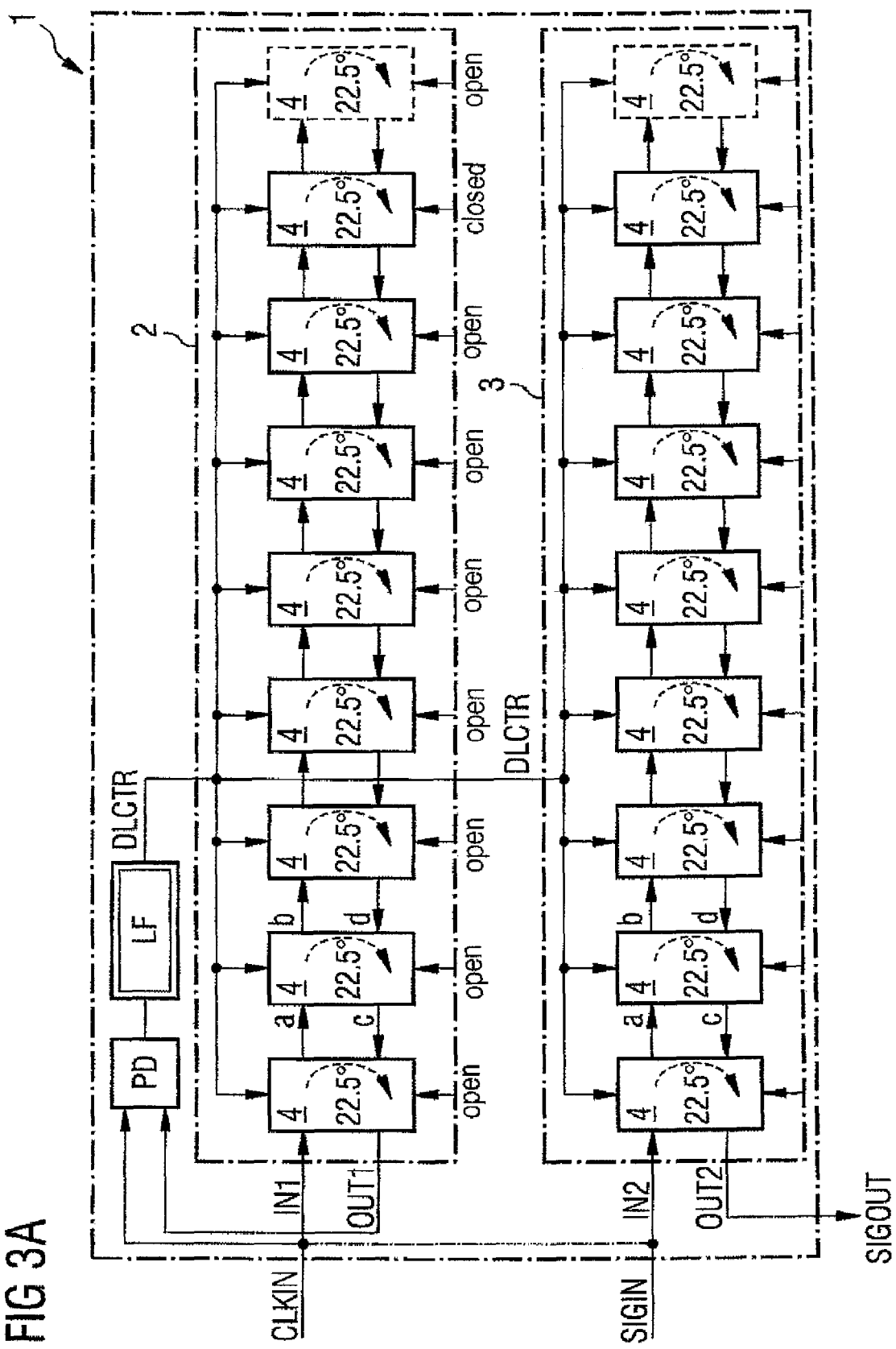
FIG. 3A schematically illustrates a first embodiment of the synchronizing device.

FIG. 3A illustrates a schematic diagram of one embodiment of the phase shifter 1 according to the invention. The phase shifter 1 is fed with an input clock signal CLKIN that may, for instance, be the reference clock signal REFCLK or a signal derived therefrom, e.g., the reference clock signal REFCLK after having passed the buffer BUF of FIG. 1. The input clock signal CLKIN is directed to an input of a phase discriminator PD and an input IN1 of a first delay line 2. An input signal SIGIN is directed to the input IN2 of a second delay line 3. The input signal SIGIN may, for instance, be a READ-DQS-Burst of a DRAM, or else the input clock signal CLKIN (this option is plotted with dashes and dots).

The two delay lines 2, 3 that are of identical construction each include nine cascaded delay elements 4 with a nominal phase shift of 22.5° each.

The delay control output DLCTR of the phase discriminator PD is transmitted via a loop filter LF to each of the delay elements 4 so as to adjust their delay.

In contrast to prior art, as it is, for instance, illustrated in FIG. 1, a signal coming in the respective signal inputs IN1, IN2 of the delay lines 2, 3 does not run through the delay lines 2, 3 unidirectionally, but forms a U-shaped signal path in each delay line 2, 3. This means that an incoming signal is directed in one direction through at least part of the delay elements and is then deflected to run through the delay elements in inverse direction again ('U-shaped' or 'folded' signal path). In the simplest case, only a first delay element 4 is run through. If the signal runs through a delay element 4 without being deflected by it, this is referred to as an 'open' state of the delay element 4. A 'closed' state of the delay element 4 is correspondingly referred to if the signal is deflected to the inverse direction by this delay element 4.

Corresponding to the construction of the delay element 4, the signal is equally delayed here in the open and in the closed state. Each delay line 4 here includes exclusively delay elements 4 that are adapted to be controlled to be optionally opening or closing, wherein the pertinent control line(s) is (are) not illustrated for the sake of a clear representation.

The delay line 2, 3 may be equipped after—or instead of—the last delay element 4 (plotted with dashes) with a pure load element that thus generates the same load conditions as a delay element 4.

By the opening or closing adjustment of the delay elements 4, the length of the U-shaped signal path and thus the phase delay between the signal inputs IN1 or IN2, respectively, and a signal output OUT1 or OUT2, respectively, of the pertinent delay line 2 or 3, respectively, can be adjusted.

In the instant embodiment, the seven first delay elements 4 (counted from the signal connections IN1, OUT1) of the first delay line 2 are open, and the eighth one is closed. This effects a phase shift of 8·22.5°=180° since, in this embodiment, a closed delay element 4 also effects a phase delay of 22.5° during deflection. With the second delay line 3, the states of the delay elements 4 can also be adjusted independently (not illustrated).

The signal output OUT1 of the first delay line 2 is connected with an input of the phase discriminator PD. The first delay line 2 and the phase discriminator PD thus form a feedback loop for the incoming clock signals CLKIN. The phase difference between the incoming clock signal CLKIN and the signal that controllably runs through the first delay line 2 is compared in the phase discriminator PD and, in the case of a deviation from a predetermined phase angle, here: 180°, the phase discriminator PD adjusts the delay elements 4 via the delay control output DLCTR up to convergence.

To output the output signal SIGOUT with the desired phase, the second delay line 3 is provided which is, in the instant embodiment, of identical structure with the first delay line 2. Since the delay elements 4 of the second delay line 3 are moreover adapted by the same delay control output DLCTR, both delay lines 2, 3 have the same characteristics.

For outputting the output signal SIGOUT with the desired phase delay, only the first closed delay element 4 is now adjusted by selection in the second delay line 3. Since the delay elements 4 of both delay lines 2, 3 are synchronized by the same delay control output DLCTR, the signal SIGOUT outgoing at the signal output OUT2 is also adjusted to be synchronized with respect to the signal SIGIN incoming at the signal input IN2. This holds in particular true with delay lines 2, 3 that are of identical structure.

The arrangement of the two delay lines 2, 3 illustrated in FIG. 3A corresponds to a master/slave configuration in which the first delay line 2 corresponds to the synchronizing master while the second delay line 3 serves as slave of the signal output.

By means of this phase shifter 1 one obtains an output signal SIGOUT from the input clock signal CLKIN with a fixed phase relationship in which no more intrinsic delay occurs by the multiplexer. Thus, the phase accuracy is improved. Moreover, this phase shifter 1 is easy to implement and to control.

The phase shifter 1 may, however, also include further delay lines that correspondingly convert further input signal to respective output signals.

FIG. 3B illustrates in a schematically simplifying manner a possible design of the delay element 4 of the phase shifter of FIG. 3 with a corresponding circuit arrangement.

An incoming signal (upper left arrow at a) runs through an adjustable buffer 5 in which the signal is delayed. The delay may be adjusted in a region via the delay control signal DLCTR. If the element 4 is open, the upper input of the 2/1 multiplexer 6 is closed, and the signal is transmitted on to the next delay element (not illustrated) (upper right arrow at b); then, after running through further elements, the signal will again arrive in inverse direction (lower right arrow at d) and get to the second buffer 7 through the open input of the multiplexer 6, from which it exits again after a further delay (lower left arrow at c). Also the second buffer is adjustable via the delay control signal DLCTR in a region. In the closed state, the upper input of the multiplexer 6 is switched open and its lower input is closed. Thus, a signal exiting from the first buffer 5 will directly get to the second buffer 7 via the multiplexer 6, and thus perform an inversion in direction. Even in the closed state both buffers 5, 7 are run through, so that a phase delay will result.

Figure 4:
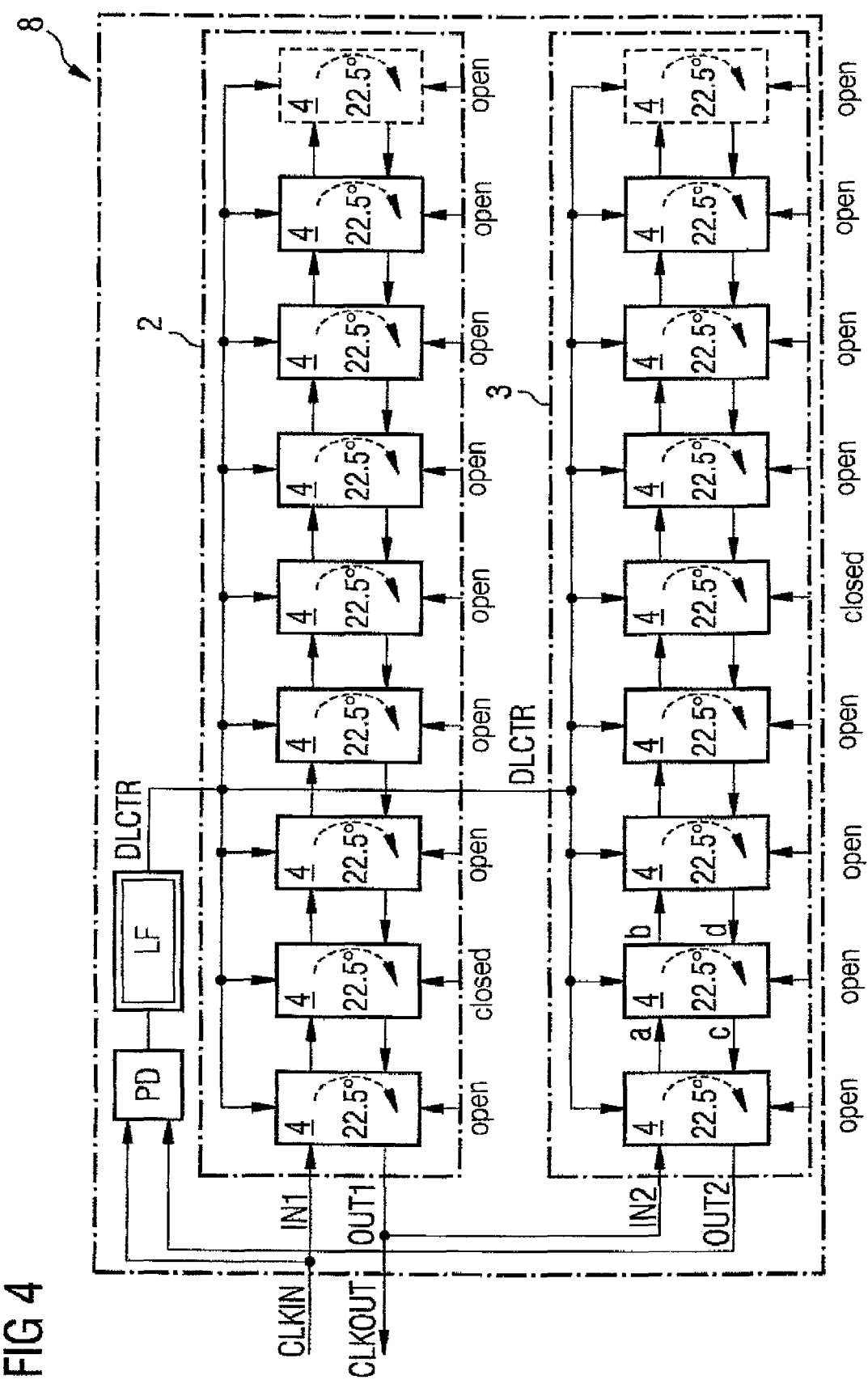
FIG. 4 illustrates a further embodiment of the synchronizing device.

FIG. 4 illustrates a further embodiment of the phase shifter 8 with the same components as in FIG. 3, which are, however, differently wired now. This embodiment is in particular suited for the generation of output clock signals CLKOUT, but not restricted thereto.

Here, the input clock signal CLKIN is, except to the phase discriminator PD, directed to the input IN1 of the first delay line 2. There, the signal is directed up to the third delay element 4 (the first closed one) from where it is directed to the pertinent signal output OUT1. In so doing, it experiences a delay of 67.5°. The signal output OUT1 is coupled with the signal input IN2 of the second delay line 3, so that the signal output by the signal output OUT1 is further delayed or phase-shifted, respectively, in the second delay line 3, namely by 112.5° (the fifth delay element 4 is closed). All in all, there results a phase shift of 180°. The signal that has been phase-shifted this way is directed via the signal output OUT2 of the second delay line 3 to the phase discriminator PD.

In this embodiment, the delay lines 2, 3 that are coupled in series thus form the feedback loop. The tapping of the output signal SIGOUT—which here corresponds to the output clock signal CLKOUT—may, for instance, be achieved by a suitable connection of the delay elements 4 of the two delay lines 2, 3, e.g., by synchronous connection such that the phase delay of the coupled delay lines 2, 3 is always 180° with changed delay proportions, e.g., n1=0 and n2=8; n1=1 and n2=7, etc.).

Thus, in this case there exists no master/slave configuration, but a double U-shaped arrangement. The phase shifter 8 may, however, also include further delay lines.

Figure 5:
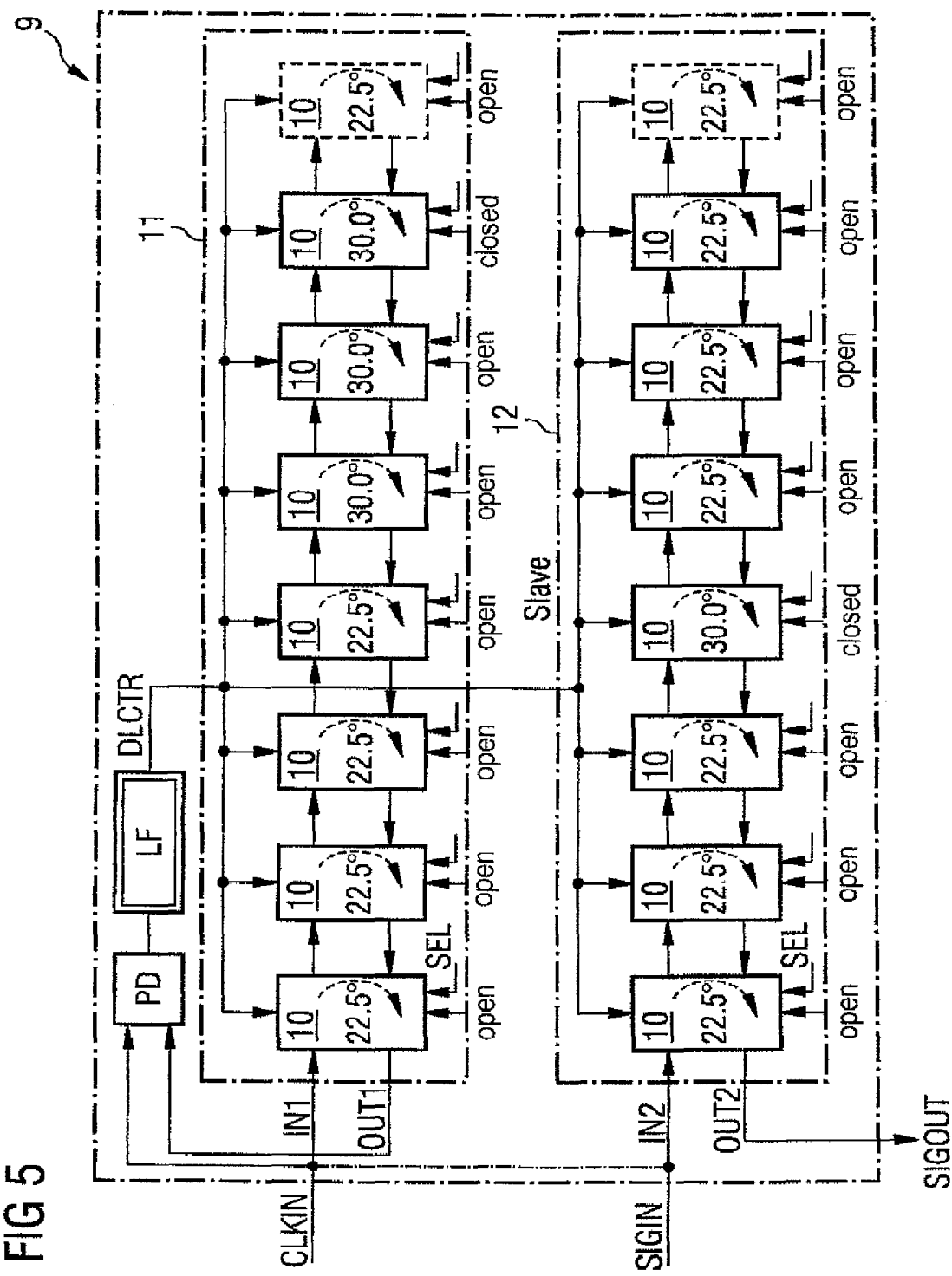
FIG. 5 illustrates a further embodiment of the synchronizing device.

FIG. 5 illustrates a further embodiment of the present phase shifter 9. Here, the wiring is identical to that of FIG. 3A with the delay elements 10 now being different.

In this embodiment, the nominal phase delay of the delay elements 10 can be changed additionally, namely can be switched by a switching signal SEL between $\Delta\phi_1=22.5°$ and $\Delta\phi_2=30°$. The control line(s) required for this is/are not illustrated for the sake of clarity. Thus, phase delays of 22.5°, 30°, 45°, 52.5°, 60°, 67.5° and so on can be adjusted in the delay lines 11, 12 at a distance of $\Delta\phi_2$ (30°)–$\Delta\phi_1$ (22.50°)=7.5°.

In most cases it is no disadvantage that some phase delays at the distance of 7.5° are missing at the beginning since most systems require a minimum, but well-defined and constant delay. The advantage of this particularly preferred arrangement is that the structure of the delay elements 10 becomes simpler for a high nominal delay, and that the number of delay elements 10 can be reduced.

In general, a delay element 10 may also be connected between more than two phase delays. Additionally, delay elements 10 with different phase delays and/or delay stages may also be used, as well as delay elements without phase delay switching together with delay elements 10 with phase delay switching.

Nor is the phase delay difference restricted, e.g., to 7.50°. Thus, delay elements 10 with switchable phase delays of 22.5° and 28.125°—corresponding to a phase delay difference of 5.625°—would, for instance, also be possible, this resulting in tappable phases of 22.5°, 28.125°, 45°, 50.625°, 56.25°, 67.5°, 73.125°, etc.

It is in particular possible with a master/slave configuration that the master delay line 11 and the slave delay line(s) 12 illustrate different phase delay characteristics. The master delay line 11 may, for instance, have relatively few delay elements, possibly with a fixed phase delay, while the slave delay line(s) 12 can be tapped with fine phase delay differences. In the extreme case, the master delay line 11 could include exactly one delay element having a nominal phase delay that corresponds to the phase angle Θ of the phase discriminator PD, e.g., Θ=180°.

The delay device 9 can, for instance, be adjusted such that the delay elements 10 of the first (master) delay line 11 are adjusted to their smaller delay value, here of (8·)22.5°, and then the first delay line 11 is calibrated to 180°. The adjusting values of the delay elements 10 are stored, and the first delay line 11 is then readjusted at different nominal phase delays, e.g., at 4·22.5°+3·30°(seventh delay element is closed).

In the delay element 10 of the phase shifter of FIG. 5, the size of the buffers can, in contrast to the delay element of FIG. 3A, be switched additionally, e.g., by means of transistor sizing, so that the second nominal phase delay is adjustable.

Figure 6:
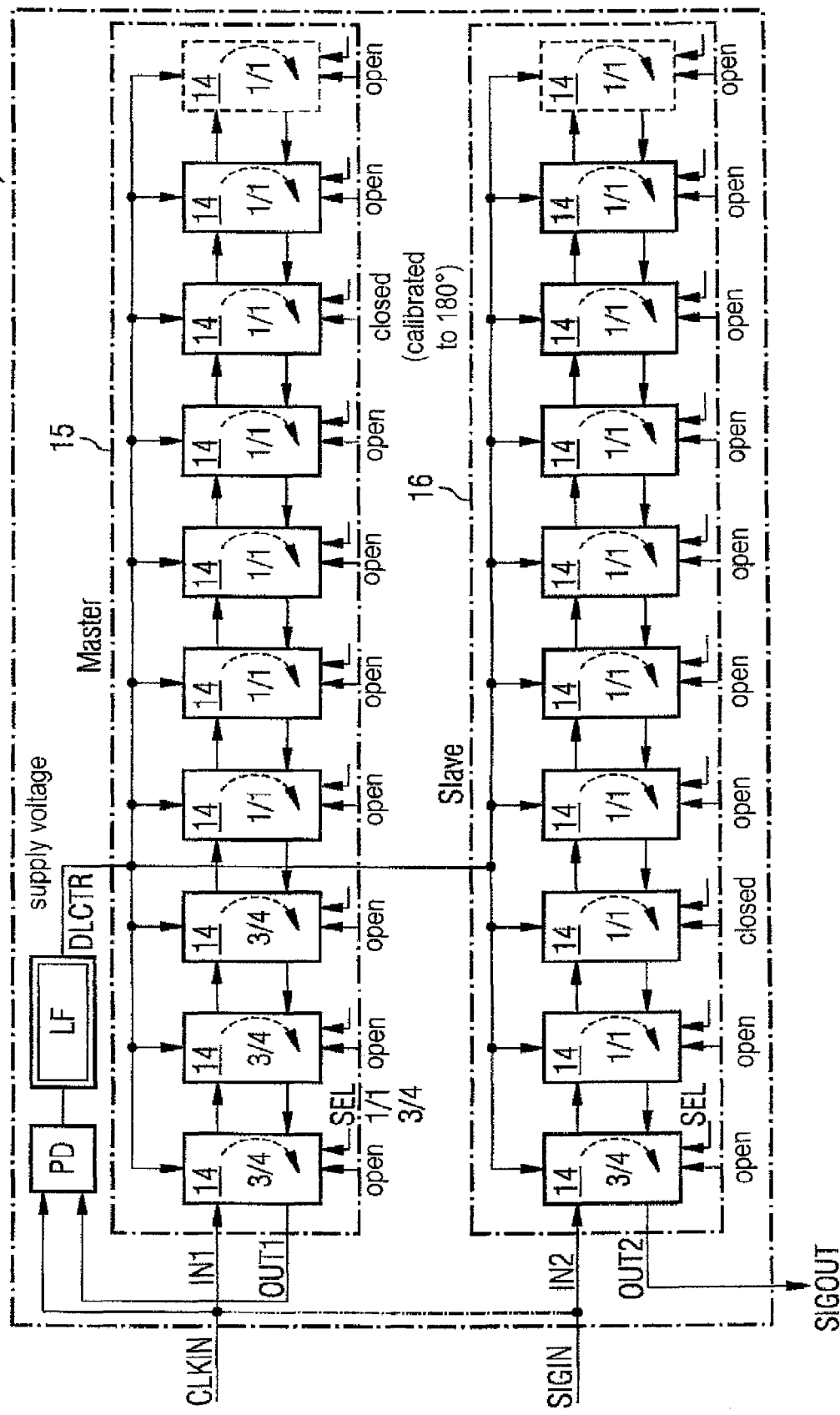
FIG. 6 illustrates a further embodiment of the synchronizing device.

FIG. 6 illustrates a more general variant of the embodiment of FIG. 5 in which the delay elements 14 are illustrated with a fractional phase delay. This means that the phase delay of the delay elements is indeed parameter-dependent, e.g., dependent on the manufacturing method, the voltage, the frequency, or the temperature, but that the relative relationship of the two adjustable nominal phase delays remains substantially constant in one parameter range, e.g., a frequency or temperature range. In other words, by the use of the fractional delay elements, a PVT-independent phase shifting relationship can be used, wherein—in particular after an initial calibration—no more mismatch has to be compensated for, although the individual phase delays are absolutely PVT-dependent. Thus, the larger phase delay ('1/1') may be 30° at a first frequency, and the smaller phase delay 22.5°('3/4'), while the phase delays at a second frequency may be 20° or 15°, respectively, and so on.

Here, the delay elements 14 need not cover the entire range of PVT and frequency changes if the 180° loop is calibrated. Thus, the total number of delay elements 14 here only has to suffice to quickly switch at the lowest frequencies. Depending on the frequency of the delay of a delay element 14, a delay may, for instance, be 10°, 20°, or 30°.

An advantage of the embodiment of FIG. 6 is the use in technologies in which the method mismatch or the method maladjustment between implemented transistors becomes critical with respect to the total delay. The problem here is that the delay error—caused by the method maladjustment—between the master delay line 15 and the slave delay line 16 and even within one delay line may become greater than the required and implemented resolution of the selectable phase. During an initial training section, the necessary delay of the slave delay line 16 is calibrated. Subsequently, the coupling between the master delay line 15 and the slave delay line 16 is only used to compensate for PVT changes. If, for instance, the supply voltage is used as a means compensating for delay, as is illustrated in FIG. 6, the first (master) delay line 15 has to compensate for temperature changes. The problem of maladjustment between the delay elements 14 is thus reduced to a problem of maladjustment of the delay changes due to a temperature difference ΔT. Thus, ΔT should cause an equal relative delay change in the delay elements of the master and salve delay lines, which is far easier to realize than a structure that takes into account all PVT changes.

As an application of such a phase shifter, the controlling of DRAMs in a Memory Host Controller has to be mentioned in particular.

The phase shifter generally is in particular a phase delay device.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A phase shifter, in particular a phase delay device, for generating a phase-delayed output signal from an input signal, comprising:
   a first delay line and at least one further delay line, each with cascaded delay elements forming a U-shaped signal path along which at least one delay element is adapted to be controlled to be optionally opening or closing;
   a phase discriminator at the input side of which a clock signal and a signal from one of the delay lines can be applied, and the output side of which is connected with a respective control input of the delay elements;
   wherein the clock signal can also be applied to the first delay line, so that a feedback loop is formed by the phase discriminator and at least one of the delay lines;

wherein the input signal can be applied to the delay line whose signal output is not connected with the phase discriminator, and the output signal can be output therefrom; and wherein in at least one switching state of the delay elements, the nominal phase delay corresponds to the nominal phase angle of the phase discriminator.

2. The phase shifter according to claim 1, wherein a plurality of further delay lines are available.

3. The phase shifter according to claim 1, wherein a signal output of the first delay line is connected with the input side of the phase discriminator.

4. The phase shifter according to claim 1, wherein a signal output of the second delay line is connected with the input side of the phase discriminator, and wherein a signal output of the first delay line is connected with a signal input of the second delay line.

5. The phase shifter according to claim 1, wherein a loop filter is placed between the phase discriminator and the delay elements.

6. The phase shifter according to claim 1, wherein the input signal corresponds to the input clock signal.

7. The phase shifter according to claim 1, wherein all the delay elements for a signal are adapted to be controlled to be optionally opening or closing on the pertinent U-shaped signal path.

8. The phase shifter according to claim 1, wherein the nominal phase angle of the phase discriminator is 180°.

9. The phase shifter according to claim 1, wherein at least one delay element is adapted to be switched between at least two phase delay values.

10. The phase shifter according to claim 9, wherein two phase delay values amount to 22.5° and 30°.

11. The phase shifter according to claim 9, wherein the phase delay values of the at least one delay element are, in a particular frequency, supply voltage, and/or temperature range, in a substantially fixed relative relationship.

12. The phase shifter according to claim 11, wherein the phase delay values are fractionally 3/4 and 1/1.

13. The phase shifter according to claim 11, wherein the supply voltage can be used as a means for compensating for delay.

14. The phase shifter according to claim 9, wherein each of the phase delay values, multiplied with a respective natural number, corresponds to the phase angle of the phase discriminator, in particular 180°.

15. A phase shifter, in particular a phase delay device, for generating a phase-delayed output signal from an input signal, comprising:

a first delay line and at least one further delay line, each with cascaded delay elements forming a U-shaped signal path along which at least one delay element is adapted to be controlled to be optionally opening or closing;

a phase discriminator at the input side of which a clock signal and a signal from one of the delay lines can be applied, and the output side of which is connected with a respective control input of the delay elements;

wherein the clock signal can also be applied to the first delay line, so that a feedback loop is formed by the phase discriminator and at least one of the delay lines;

wherein the input signal can be applied to the delay line whose signal output is not connected with the phase discriminator, and the output signal can be output therefrom;

wherein a plurality of further delay lines are available; and wherein the plurality of further delay lines are available at which a respective input signal can be applied and from which a respective output signal can be output.

16. A phase shifter, in particular a phase delay device, for generating a phase-delayed output signal from an input signal, comprising:

a first delay line and at least one further delay line, each with cascaded delay elements forming a U-shaped signal path along which at least one delay element is adapted to be controlled to be optionally opening or closing;

a phase discriminator at the input side of which a clock signal and a signal from one of the delay lines can be applied, and the output side of which is connected with a respective control input of the delay elements;

wherein the clock signal can also be applied to the first delay line, so that a feedback loop is formed by the phase discriminator and at least one of the delay lines;

wherein the input signal can be applied to the delay line whose signal output is not connected with the phase discriminator, and the output signal can be output therefrom;

wherein a plurality of further delay lines are available; and wherein the plurality of further delay lines are connected in series as a signal path of the feedback loop.

17. A phase shifter, in particular a phase delay device, for generating a phase-delayed output signal from an input signal, comprising:

a first delay line and at least one further delay line, each with cascaded delay elements forming a U-shaped signal path along which at least one delay element is adapted to be controlled to be optionally opening or closing;

a phase discriminator at the input side of which a clock signal and a signal from one of the delay lines can be applied, and the output side of which is connected with a respective control input of the delay elements;

wherein the clock signal can also be applied to the first delay line, so that a feedback loop is formed by the phase discriminator and at least one of the delay lines;

wherein the input signal can be applied to the delay line whose signal output is not connected with the phase discriminator, and the output signal can be output therefrom; and wherein at least one delay element is adapted to be switched between at least two phase delay values, wherein each of the phase delay values, multiplied with a respective natural number, corresponds to the phase angle of the phase discriminator.

18. A method for generating a phase-delayed output signal from an input signal, comprising:

adjusting delay elements in that the phases of an input clock signal and of a signal that has run through at least one of at least two delay lines are compared in a phase discriminator, and in that, on the basis of this comparison, the delay elements are adjusted to the phase angle of the phase discriminator;

feeding an input signal into one of the at least two delay lines with respectively cascaded delay elements which each form a U-shaped signal path along which at least one controllable delay element is adapted to be controlled to be optionally opening or closing, and outputting the input signal that has run through the delay line as output signal;

selecting a phase shift between the output signal and the input signal by controlled opening and closing of the at least one controllable delay element; and switching at least one delay element from one phase delay value to at least one other phase delay value, in which an integer multiple of each phase delay value corresponds to the phase angle of the phase discriminator.

19. The method according to claim 18, comprising comparing the phases of the input clock signal and of the signal that has run through a first one of the two delay lines in the phase discriminator, and feeding a respective input signal into a respective further delay line, and the input signal that has run through the delay line is output as respective output signal.

20. The method according to claim 18, comprising connecting, at least two delay lines one after the other, so that the input signal can run through all delay lines in at least one switching position.

21. The method according to claim 18, in which the phase delay values of the at least one delay element are in a substantially fixed relative relationship in a particular frequency, supply voltage, and/or temperature range.

22. The method according to claim 18, comprising adjusting supply voltage for adjusting a phase shift compensation.

23. A phase shifter, in particular a phase delay device, for generating a phase-delayed output signal from an input signal, comprising:

a first delay line and at least one further delay line, each with cascaded delay elements forming a U-shaped signal path along which at least one delay element is adapted to be controlled to be optionally opening or closing;

means for providing a phase discriminator at the input side of which a clock signal and a signal from one of the delay lines can be applied, and the output side of which is connected with a respective control input of the delay elements;

wherein the clock signal can also be applied to the first delay line, so that a feedback loop is formed by the phase discriminator means and at least one of the delay lines;

wherein the input signal can be applied to the delay line whose signal output is not connected with the phase discriminator means, and the output signal can be output therefrom; and wherein at least one delay element is adapted to be switched between at least two phase delay values, in which an integer multiple of each phase delay value corresponds to the phase angle of the phase discriminator means.

* * * * *